United States Patent [19]
Dodson

[11] Patent Number: 5,787,971
[45] Date of Patent: *Aug. 4, 1998

[54] MULTIPLE FAN COOLING DEVICE

[76] Inventor: Douglas A. Dodson, 5995 Avenida Encinas, Carlsbad, Calif. 92008

[*] Notice: The term of this patent shall not extend beyond the expiration date of Pat. No. 5,638,895.

[21] Appl. No.: 854,453

[22] Filed: May 12, 1997

Related U.S. Application Data

[63] Continuation-in-part of Ser. No. 621,448, Mar. 5, 1996, Pat. No. 5,638,895, and a continuation-in-part of Ser. No. 64,341, Dec. 30, 1996, Pat. No. Des. 389,807.

[51] Int. Cl.[6] .................................................. H05K 7/20
[52] U.S. Cl. ........................ 165/121; 165/80.3; 361/697
[58] Field of Search .............................. 165/80.3, 121, 165/185; 361/697, 704; 174/16.3

[56] References Cited

U.S. PATENT DOCUMENTS

| | | | |
|---|---|---|---|
| 3,592,260 | 7/1971 | Berger | 165/121 |
| 4,027,206 | 5/1977 | Lee | 361/384 |
| 4,158,875 | 6/1979 | Tajima et al. | 361/384 |
| 4,233,644 | 11/1980 | Hwang et al. | 174/16.3 X |
| 4,277,816 | 7/1981 | Dunn et al. | 361/384 |
| 4,399,485 | 8/1983 | Wright et al. | 361/383 |
| 4,513,812 | 4/1985 | Papst et al. | 165/80.3 |
| 4,807,441 | 2/1989 | Agee et al. | 62/3 |
| 5,029,236 | 7/1991 | Yasuda et al. | 455/90 |
| 5,277,547 | 1/1994 | Washizu | 415/208.1 |
| 5,309,983 | 5/1994 | Bailey | 165/80.3 |
| 5,341,871 | 8/1994 | Stelzer | 165/121 |
| 5,526,875 | 6/1996 | Lin | 165/80.3 |
| 5,528,454 | 6/1996 | Niklos | 361/695 |
| 5,638,895 | 6/1997 | Dodson | 165/121 |

FOREIGN PATENT DOCUMENTS

| | | | |
|---|---|---|---|
| 3-268394 | 11/1991 | Japan | 361/697 |
| 5-206668 | 8/1993 | Japan | 361/697 |

*Primary Examiner*—Allen J. Flanigan
*Attorney, Agent, or Firm*—Calif Tervo

[57] ABSTRACT

A cooling device for an electronic component, such as a computer processor, generally comprises a heat sink and a plurality of fans. The fans are redundant in that sufficient cooling is supplied should one fan fail. The fans are independently powered and are inspectable and independently replaceable in situ without un-powering the other fan or the processor. The heat sink includes a base plate having a bottom for surface contact with the processor, a front row of fins projecting upward from the front of the base plate and a rear row of fins projecting upward from the rear of the base plate. A plurality of fans are mounted substantially within a cavity between fan rows. Each fan blows a flow of air such that the flow impinges on the base plate. A central channel between the front and rear fin rows provides a path for air such that should one fan fail, the other fans still being operable for generating a flow of air that impinges on the top surface beneath the failed fan for cooling the top surface beneath the failed fan.

3 Claims, 5 Drawing Sheets

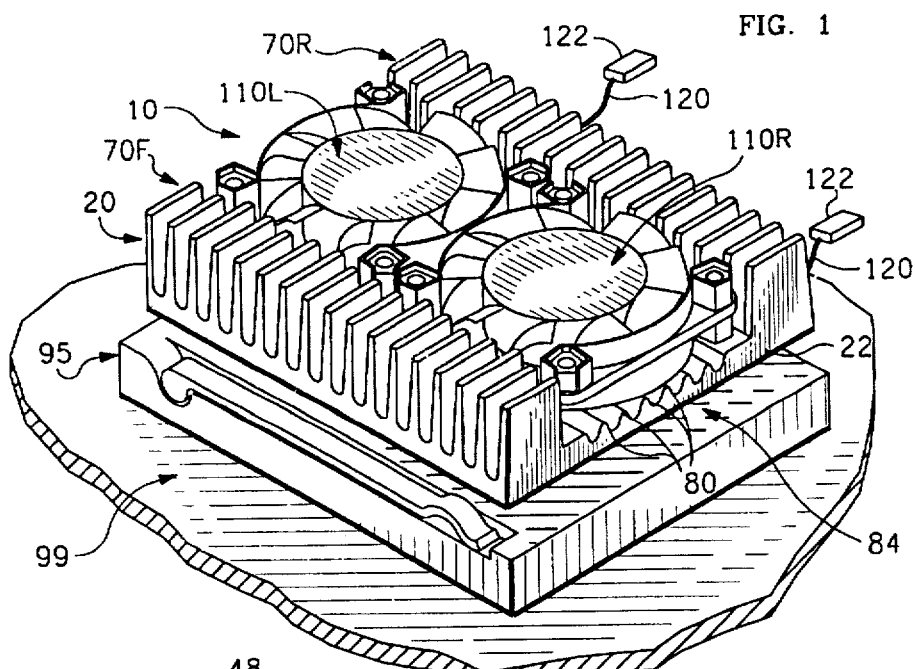
FIG. 1
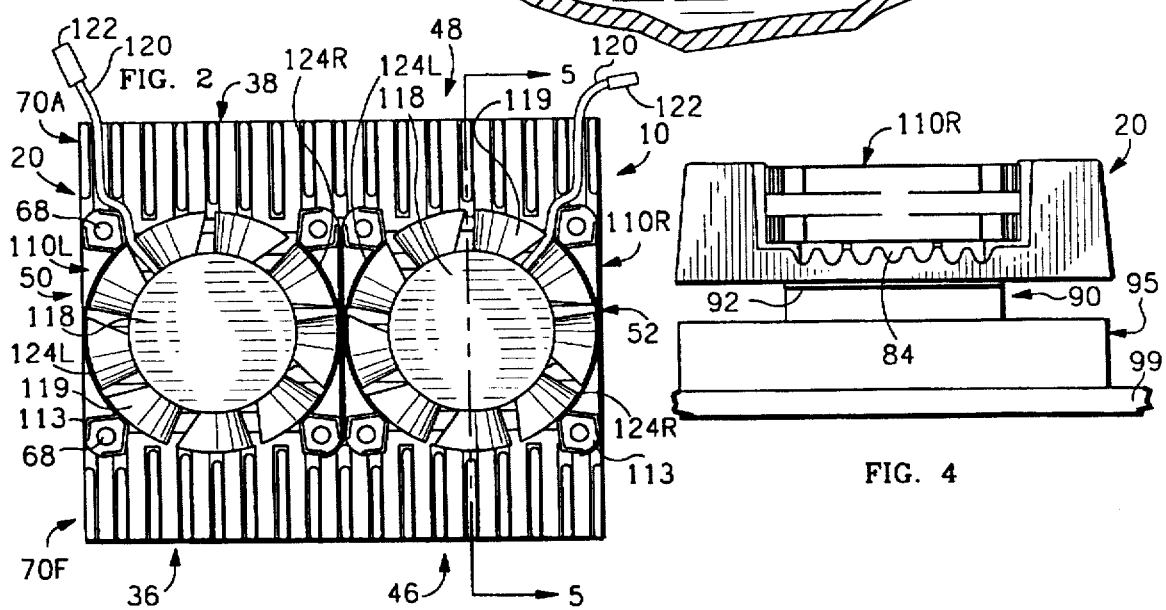
FIG. 2
FIG. 4
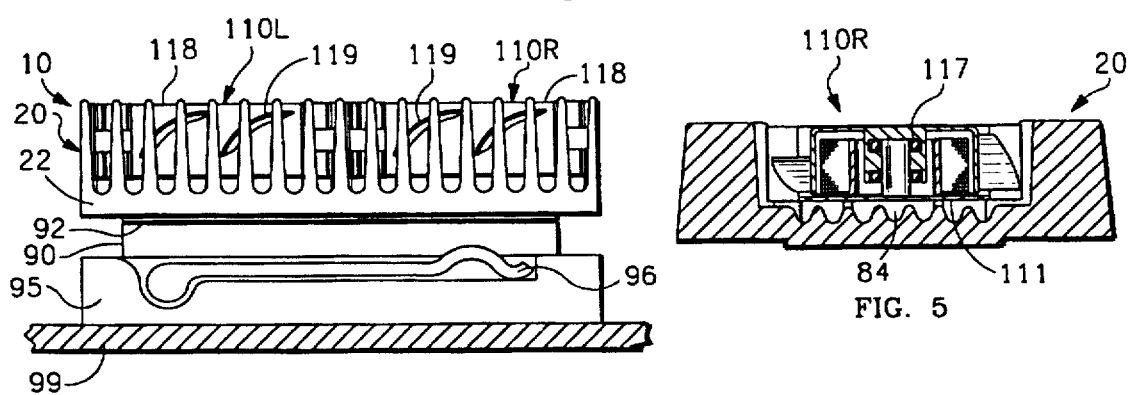
FIG. 3
FIG. 5

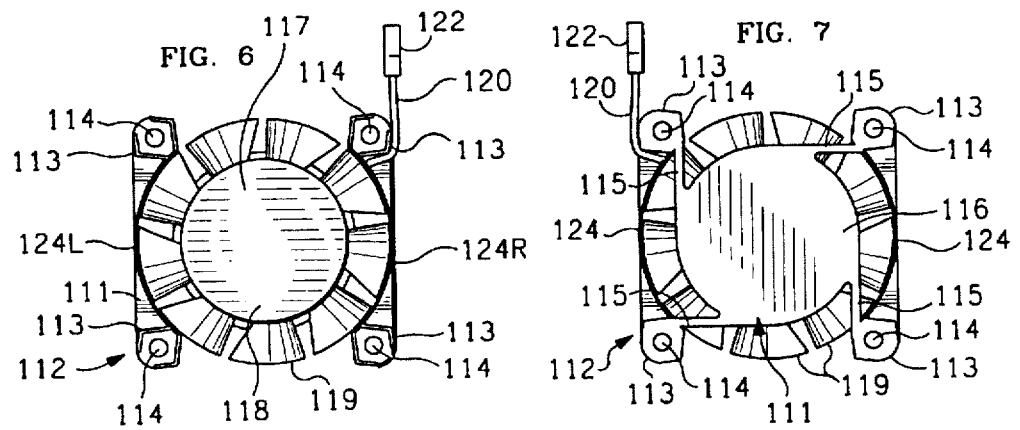
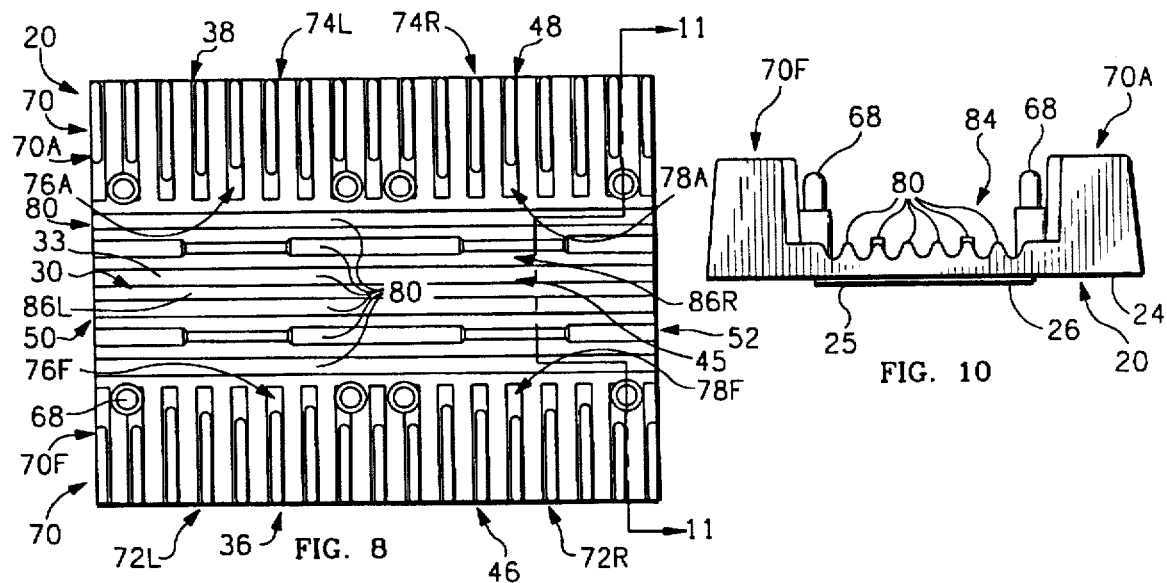
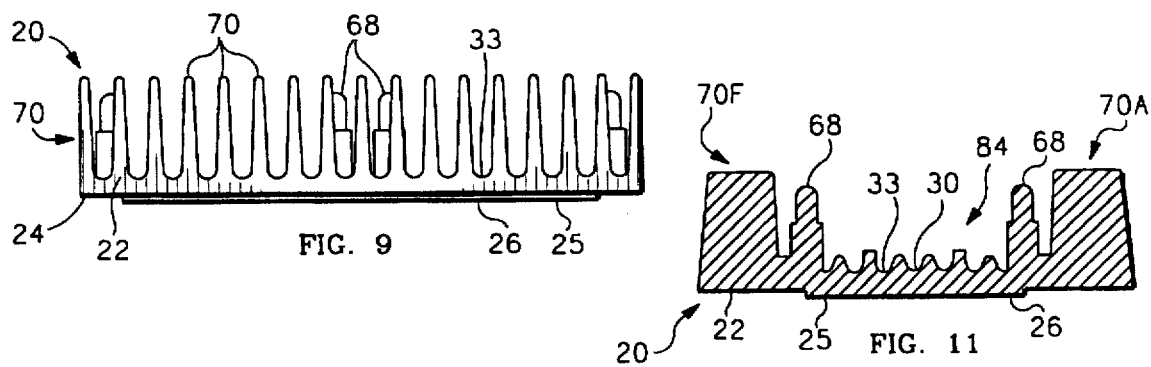

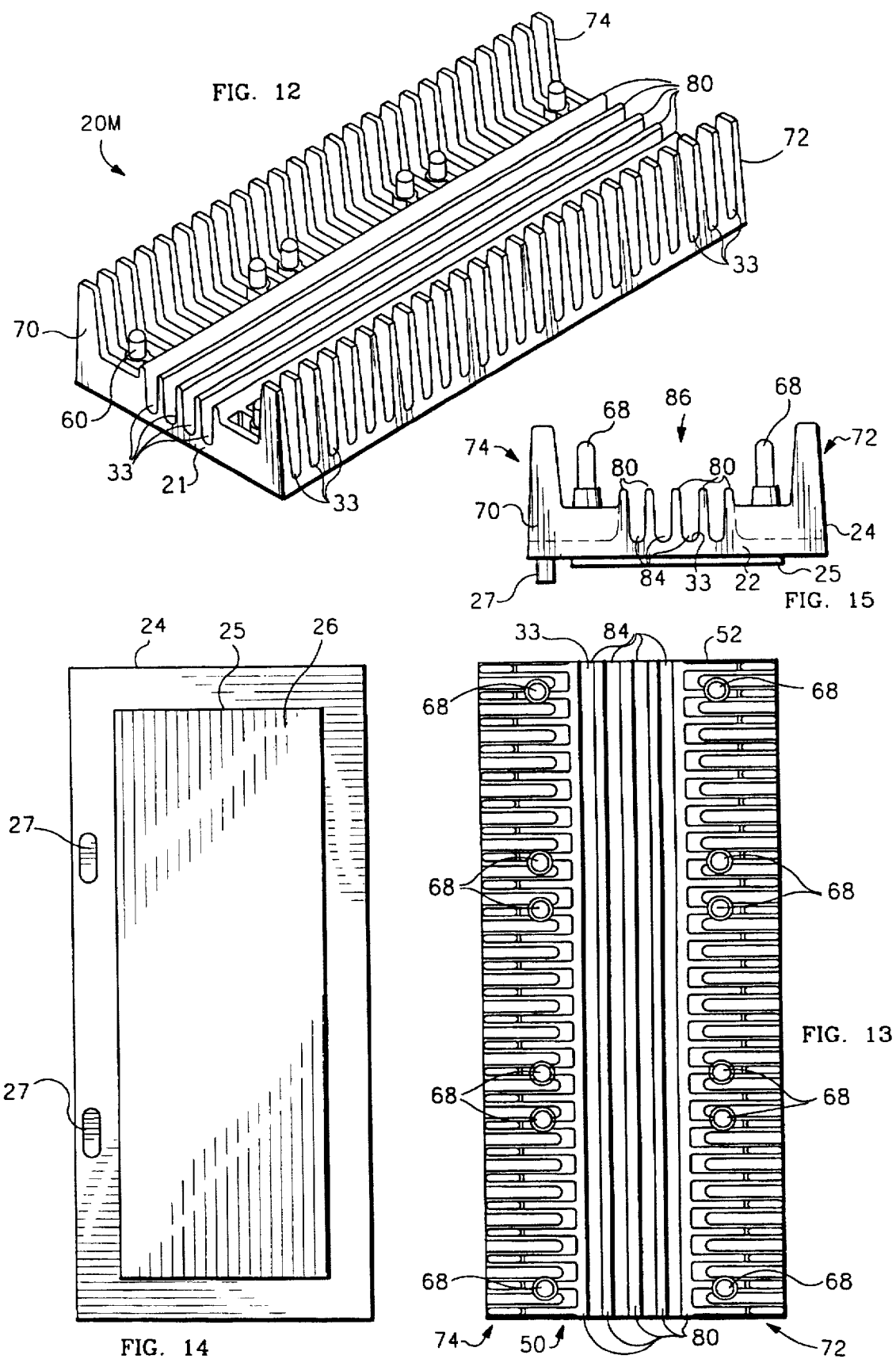

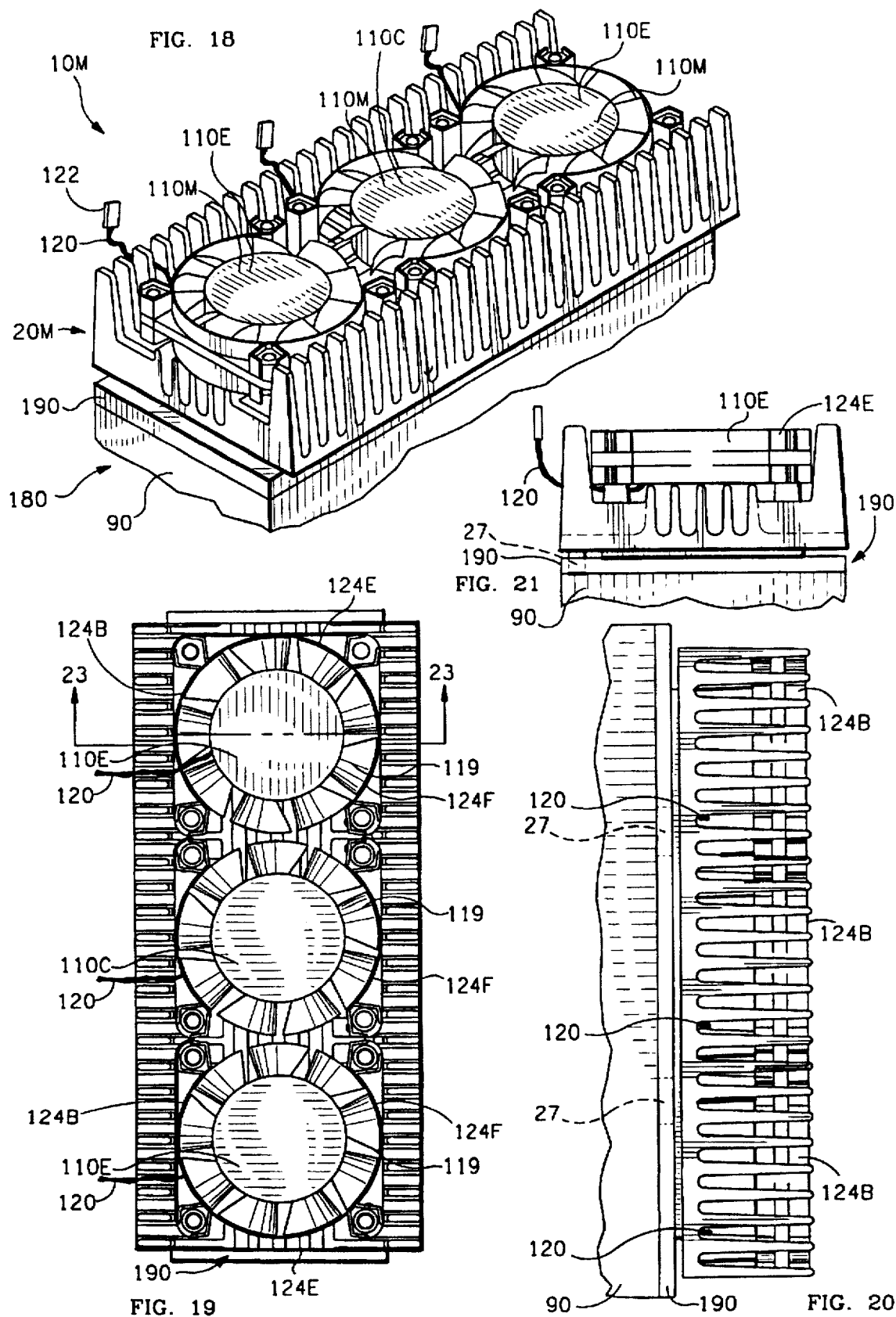

MULTIPLE FAN COOLING DEVICE

CROSS REFERENCE TO RELATED APPLICATIONS

This application is a continuation-in-part of applications: Ser. No. 29/064,341 filed Dec. 30, 1996 titled "Cooling Device" now U.S. Pat. No. D. 389,807 and Ser. No. 08/621,448 filed Dec. 30, 1996 titled "Twin Fan Cooling Device" now U.S. Pat. No. 5,638,895 filed Mar. 5, 1996.

BACKGROUND OF THE INVENTION

1. Field of the Invention

This invention relates in general to a cooling device for an electronic component and more specifically to a integrated heat sink and a plurality of fans for cooling a semiconductor device such as a computer processor.

2. Background of the Invention

Many current electronic components, such as computer processors, such as Intel's Pentium Pro processor and Pentium II, generate significant heat internally during operation which must be dissipated or the processor will fail or otherwise malfunction. There are several constrains on such cooling devices. Since it is desirable that the printed circuit board containing the processor plug into a conventional backplane and not occupy space reserved for other boards, the size of the cooling unit is limited. also, it is difficult to achieve a plentiful flow of air between the boards to adequately dissipate heat from the heat sink. Consequently, small heat sinks including an attached fan have been developed for attachment to processors.

However, there are still two major problems associated with the current art. First, fans are electromechanical devices that are subject to a failure rate significantly higher than pure electronic components. Since the cooling capacity of the heat sink is dependent upon the operation of the fan, failure of the fan results in failure of the processor. Second, some processors not only malfunction upon temperature buildup but are damaged. In these instances, failure of a fan results in the computer going down and the costly replacement of the processor. Third, many modern applications require that the processor be operating at all times. Should the computer go down, the application being performed will be irretrievably damaged resulting in considerable time and money loss.

Thus, it is desirable to have an improved cooling device for a processor such that the cooling device has a longer mean time between failures.

It is further desirable that the improved cooling device includes redundant components that, while the device is operation in situ, are easily inspectable for failure and independently replaceable such that the processor need never malfunction, fail or be damaged due to failure of the cooling device.

SUMMARY OF THE INVENTION

According to the invention, a cooling device for an electronic component, such as a computer processor, generally comprises a heat sink and a plurality of fans. The heat sink includes a base plate having a bottom for surface contact with the electronic component, a front row of fins projecting upward from the front of the base plate and a rear row of fins projecting upward from the rear of the base plate. Front row fins and rear row fins have a front to rear orientation. The inner ends of the front fins are spaced from inner ends of the rear so as to define a cavity therebetween. Fans are mounted substantially within the cavity. Each fan blows a flow of air such that the flow impinges on the base plate. The maximum external dimensions of the heat sink define a box or envelope and, preferably, the fans are contained within the envelope. A central channel between front and rear fin rows provides a path for air impinging to flow under the fans such that, should a fan fail, the air from the other fans flows under the failed fan.

The fans are redundant in that sufficient cooling is supplied should one fan fail. The fans are independently powered in that failure of one fan does not result in failure of the other. The fans are inspectable in situ. A failed fan may be independently replaced in situ without un-powering the other fan or the processor.

Other features and many attendant advantages of the invention will become more apparent upon a reading of the following detailed description together with the drawings in which like reference numerals refer to like parts throughout.

BRIEF DESCRIPTION OF THE DRAWINGS

FIG. 1 is a perspective view of a preferred embodiment of the cooling device of the invention mounted on an electronic component (not seen) that is in a socket on a printed circuit board.

FIG. 2 is a top plan view of the cooling device of FIG. 1.

FIG. 3 is a front elevation view of the cooling device and electronic component, socket and printed circuit board of FIG. 1.

FIG. 4 is an end elevation view of the cooling device of FIG. 1.

FIG. 5 is a sectional view taken on line 5—5 of FIG. 2.

FIG. 6 is a top plan view of a fan of FIG. 1.

FIG. 7 is a bottom plan view of the fan of FIG. 6.

FIG. 8 is a top plan view of the heat sink portion of the cooling device of FIG. 1.

FIG. 9 is a front elevation view thereof, the rear view being a mirror image.

FIG. 10 is a right end elevation view thereof, the left end being a mirror image.

FIG. 11 is a sectional view thereof taken on line 11—11 of FIG. 8.

FIG. 12 is a perspective view of a heat sink of an alternate preferred embodiment of the cooling device of the invention.

FIG. 13 is a top plan view of the heat sink of FIG. 12.

FIG. 14 is a bottom plan view of the heat sink of FIG. 12.

FIG. 15 is an end elevation view of the heat sink of FIG. 12.

FIG. 18 is a perspective view of the entire alternate preferred embodiment of the cooling device of the invention.

FIG. 19 is a top plan view of the alternate cooling device of FIG. 18.

FIG. 20 is a rear elevation view thereof.

FIG. 21 is a left end elevation view thereof.

DETAILED DESCRIPTION OF THE INVENTION

Figure 22:
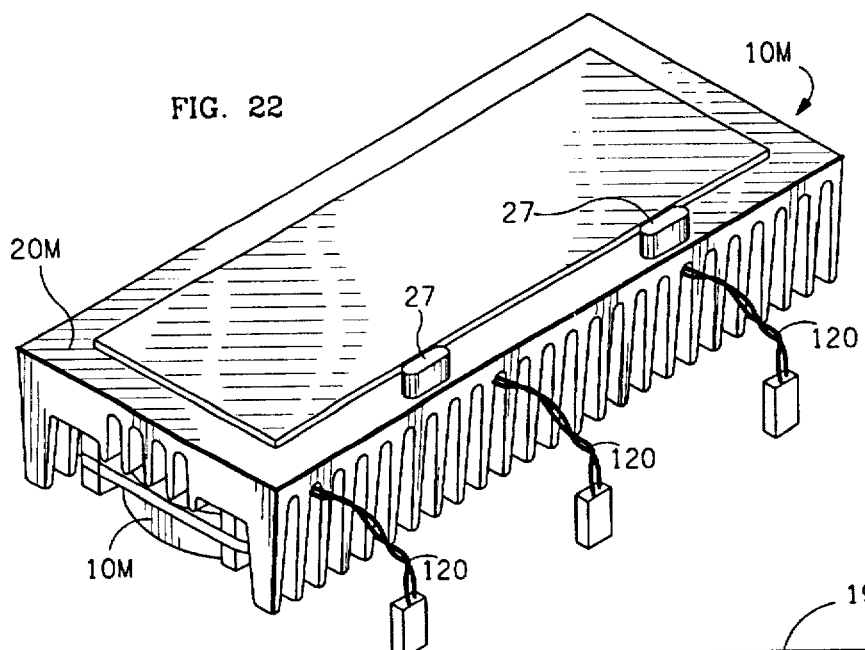
FIG. 22 is a bottom perspective view thereof.

With reference now to the drawings, and more specifically to FIGS. 1, 3 and 4 thereof, there is shown in FIG. 1 a perspective view of a preferred embodiment of the cooling device, generally denoted as 10, of the invention and, in FIG. 3 a front elevation view and in FIG. 4 an end elevation view, of cooling device 10 and typical environment including electronic component 90, socket 95 and printed circuit board 99.

cooling device 10 is mounted upon an electronic component, such as a semiconductor component, such as processor 90 that is sensitive to heat. Processor 90 is plugged into socket 95. Lever 96 is manipulated to clamp processor 90 into socket 95 and make electrical connections between socket 95 to processor 90. Socket 95 is attached to printed circuit board 99, shown partially cut away. Although a socket 95 is commonly used to mount processor 90, a socket 95 is not necessary for the functioning of the invention. The top surface 92 of processor 90 emits heat. Top surface 92 is generally flat and rectangular.

Cooling device 10 generally comprises a heat sink, denoted generally as 20, and a plurality of fans 110, such as left fan 110L and right fan 110R.

FIGS. 5, 6 and 7 best show fans 110. The general nature of the fans 110 of the invention are well-known. In the preferred embodiment, each fan 110 generates an air flow of about three cubic feet per minute. Left fan 110L and right fan 110R may be identical. FIG. 5 is a sectional view taken on line 5—5 of FIG. 2 showing a fan 110 in cross-section. FIG. 6 is a top plan view of a fan 110 of FIG. 1. FIG. 7 is a bottom plan view of the fan 110 of FIG. 6.

Fans 110 generally include a housing 111 and a motor 117. Housing 111 includes mounting means, denoted generally as 112, including mounts 113 including bores 114, braces 115 attached to mounts 113 and a central platform 116 supported by braces 115. Electrical motor 117, supported on central platform 116, includes a rotor 118 having peripheral blades 119. Fans 110 are individually electrically powered by a power cord 120 including an electrical connector 122 for connection to a power source, such as a power supply, not shown. Thus, each fan 110 operates independently of the operation of the other fan 110. Rotor 117 rotates about a vertical axis such that blades 119 rotate in a horizontal plane and generate a flow of air that is pulled downward and impinges on heat sink 20. Air is also forced out of the sides of fan 110. The path of the tips of the blades define a fan circumference. Each fan 110 may include a partial shroud 124, such as left shroud 124L and right shroud 124R, attached to fan housing 111. Left and right shrouds 124L, 124R are disposed immediately adjacent the fan circumference and block air from exiting blades 119 directly horizontally to the left or right such that air exiting left or right is first forced downward to impinge on heat sink 20. It can be seen that shrouds 124 need not be part of fan 110 and could be part of heat sink 20, that is could be similar to a cooling fin except with a slot beneath for air passage.

FIGS. 8–11 best show the construction of a preferred embodiment of heat sink 20. FIG. 8 is a top plan view of the heat sink portion 20 of cooling device 10 of FIG. 1. FIG. 9 is a front elevation view thereof. FIG. 10 is a end elevation view thereof. FIG. 11 is a sectional view thereof taken on line 11—11 of FIG. 8.

Heat sink 20 may be constructed out of any suitable material having a high coefficient of thermal conductivity, such as aluminum or copper or their alloys, as is well-known in the art.

Heat sink 20 generally comprises a base plate 22 and a number of heat-dissipating fins 70. Base plate 22 includes a bottom 24 and a top 30. Bottom 24 of base plate 22 includes a contact surface 26 adapted for substantial surface contact with the heat-emitting surface 92 of electronic component 90. In the preferred embodiment shown, contact surface 26 is on a thickened portion 25 of base plate 22 such that the remainder of bottom 24 is separated a distance from the component 90 and socket 95 thereby allowing some heat dissipation from bottom 24. Heat sink 20 is attached to component 90 by any means well-known in the art which may include gluing or using a resilient retainer. Either attachment method may utilize a thermal compound between top surface 92 of component 90 and contact surface 26 of heat sink 20 that aids in heat transfer.

Top 30 of base plate 22 includes a generally planar surface 33, a left side 35 including a front 36 and a rear 38, a right side 45 including a front 46 and a rear 48, a left end 50 and a right end 52. Mounting means, such as fan mounting posts 68, project upward from surface 33 and are adapted for receiving and retaining fan mounting bores 114 such that fans 110 are held in place.

Fins 70 generally project upward from top 30 of base plate 22 and are thin and elongated. Fins 70 include a front row 70F of fins 70, a rear row 70A of fins 70 and lateral fins 80.

Front f in row 70F comprises a plurality of left front fins 72L and a plurality of right front fins 72R. Left front fins 72L project upward from front 36 of left side 35 of top 30. Each left front fin 72L is oriented generally front to rear and separated by a space from adjacent left front fins 72L so as to allow air flow between them. Each right front fin 72R projects upward from front 46 of right side 45 of top 30 and are oriented generally front to rear and separated by a space from adjacent right front fins 72R so as to allow air flow between them.

Rear fin row 70A comprises a plurality of left rear fins 74L and a plurality of right rear fins 74R. Left rear fins 74L project upward from rear 38 of left side 35 of top 30. Each left rear fin 74L is oriented generally rear to rear and separated by a space from adjacent left rear fins 74L so as to allow air flow between them. Each right rear fin 72R project upward from rear 48 of right side 45 of top 30 and are oriented generally front to rear and separated by a space from adjacent right rear fins 74R so as to allow air flow between them.

The inner ends 76F of front left fins 72L are separated from inner ends 76A of rear left fins 74A so as to define a left cavity 86L therebetween. Preferably, left fan 110L is disposed substantially within left cavity 86L, preferably, such that air can flow under left fan 110L.

The inner ends 78F of front right fins 72R are separated from inner ends 78A of rear right fins 74R so as to define a right cavity 86R therebetween. Preferably, right fan 110R is disposed substantially within right cavity 86R, preferably, such that air can flow under right fan 110R.

As best seen in FIGS. 3 and 4, the maximum external dimensions of heat sink 20 define a box or envelope and fans 110L, 110R are contained within the envelope. Basically, all of the space in the envelope is occupied by fans 110 and fins 70 and the spaces between fins.

The bottoms of cavities 86L, 86R are connected by a central channel 84 such that air may flow laterally between the bottoms of the cavities 86L, 86R. Central channel 84 provides a path for air impinging on left side 35 of top 30 to flow to right side 45 and for air impinging on right side 45 to flow to left side 35. In the preferred embodiment, central channel 84 extends laterally the entire top 30 of heat sink 20 and left cavity 86L and right cavity 86R are joined.

A plurality of channel or lateral fins 80 within central channel 84 project upward from planar surface 33 and have a left-right orientation. Lateral fins 80 dissipate heat to air flowing in channel 84 and especially aid in heat dissipation should one fan fail.

Left fan 110L is mounted to heat sink 20 above left side 35 of top 30. Left fan 110L is operable for generating a flow of air such that the flow impinges on left side 35 of top 30 including on central channel 84 and exits top 30 to left end 50, between left front fins 72L to front 36 of left side 35 and between left rear fins 74L to rear 38 of left side 35. Should right fan 110R fail, left fan 110L is still operable for generating a flow of air such that the flow of air impinges on left side 36 of top 30 including on central channel 84 and flows via central channel 84 to right side 45 of top 30 and exits top 30 to left end 50, between left front fins 72L to front 36 of left side 35, between left rear fins 74L to rear 38 of left side 35, between right front fins 72R to front 46 of right side 45, between right rear fins 74R to rear 48 of right side 45 and to right end 52 such that processor 90 is sufficiently cooled.

Right fan 110R is mounted to heat sink 20 above right side 45 of top 30. Right fan 110R is operable for generating a flow of air such that the flow impinges on right side of top 30 including on central channel 84 and exits top 30 to right end 52, between right front fins 72R to front 46 of right side 45 and between right rear fins 74R to rear 48 of right side 45, and, should left fan 110L fail, right fan 110R is still operable for generating a flow of air such that the flow of air impinges on right side 45 of top 30 including on central channel 84 and flows via central channel 84 to left side 35 of top 30 and exits top 30 to right end 52, between right front fins 72R to front 46 of right side 45, between right rear fins 74R to rear 48 of right side 45, between left front fins 72L to front 36 of left side 35, between left rear fins 74L to rear 38 of left side 35 and to left end 50 such that processor 90 is sufficiently cooled.

A cooling device 10 according to the above description was used to cool an Intel Pentium© Pro Processor. The device 10 was made of aluminum and has a base plate thickness of 0.185 inches and channel fin height of 0.100 inches. Both fans blew air at a rate of three cubic feet per minute. The ambient air was 25 degrees Celsius. With both fans operating, the processor was maintained at 40 degrees Celsius. With one fan failure, the processor was maintained at 45 degrees Celsius; well within the processor's specifications.

FIGS. 12–23 show an alternate preferred embodiment of the invention. Looking first at FIG. 18, there is shown a perspective view of the entire alternate preferred embodiment of the multiple fan cooling device 10M of the invention. Cooling device 10M is similar in many respects to cooling device 10 of FIG. 1 with differences as noted below. The cooling device 10M includes, in general, a heat sink 20M for mounting on an electronic component, denoted generally as 180, and at three fans 110M mounted to heat sink 20M for generating a downward flow of air onto heat sink 20M. Electronic component 180 may be a processor 90 including a thermal plate 190.

Figure 17:
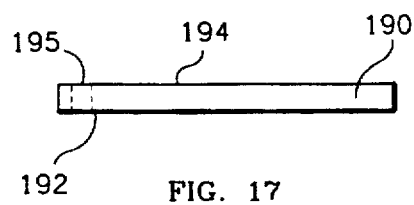
FIG. 17 is an end elevation view of the thermal plate of FIG. 16.
Figure 16:
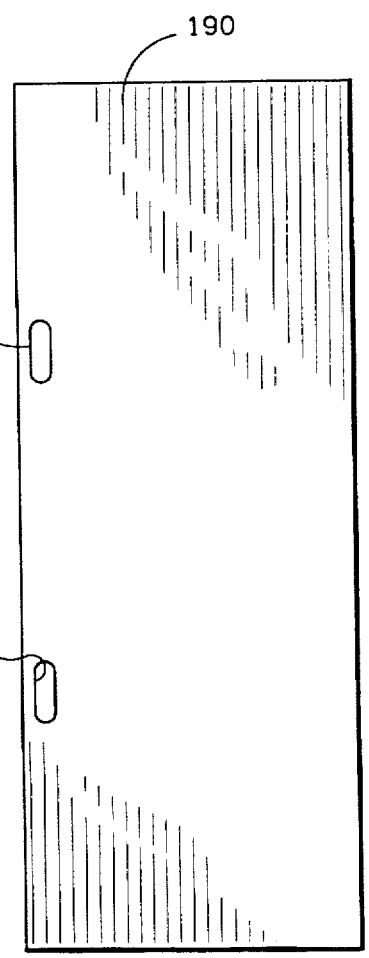
FIG. 16 is a top plan view of a thermal plate.

FIGS. 16 and 17 illustrate a typical thermal plate 190 with FIG. 16 being a top plan view and FIG. 17 being an end elevation view. Thermal plate 190 is a metal heat dissipating plate disposed to contact top surface 92 of processor 90 such as being attached thereto by any suitable means as is known in the art. Thermal plate 190 includes a bottom surface 192 for contact with top surface 92 of processor 90 and a generally planar top surface 194. Preferably, thermal plate 190 includes mounting means, such as cavities 195 in top surface 194, for mounting cooling device 10M thereon.

FIGS. 12—15 illustrate the features of heat sink 20M. FIG. 12 is a perspective view of heat sink 20M. FIG. 13 is a top plan view, FIG. 14 is a bottom plan view and FIG. 15 is an end elevation view of the heat sink of FIG. 12. The bottom 24 of heat sink 20M includes a thickened portion 25 including a contact surface 26 adapted for surface contact with the top of electrical component 180. In the embodiment shown, contact surface 25 is flat for contact with the flat top surface 194 of thermal plate 190. Mounting means, such as pegs 27 extending downward from base plate 22, cooperate with the mounting means on thermal plate 190 for mounting heat sink 20M to electronic component 180. Pegs 27 are inserted into cavities 195 to align heat sink 20M and to prevent relative movement in shear. Contact surface 26 is held in contact with thermal plate 190 by any suitable means well known in the art, such as glue, adhesive and resilient retainer.

On top 30, fins 30 project upward from a generally planar surface 33. Lateral fins 80 are centrally located and oriented from end 50 to end 52. Lateral fins 80 preferably have a height of approximately half the height of heat sink 20M. Lateral fins 80 form central channels 84 through which air can flow and exit ends 50, 52. Front row fins 72 are oriented front to back and forward from the front-most lateral fin 80 and rear row fins 74 are oriented front to back and rearward from the rear-most lateral fin 80. The outer ends of front and rear row fins 72, 74 extend upward to define a cavity 86 therebetween for containing fans 110M.

Figure 23:
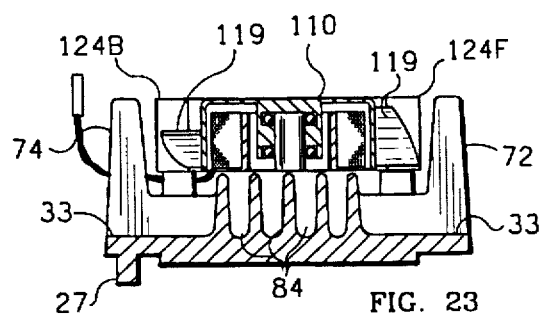
FIG. 23 is a sectional view taken on line 23—23 of FIG. 16.

Returning to the entire cooling device 10M shown in FIGS. 18–23, there is shown in FIG. 19 a top plan view, in FIG. 20 a rear elevation view, in FIG. 21 a left end elevation view, in FIG. 22 a bottom perspective view and in FIG. 23 a sectional view taken on line 23—23 of FIG. 16.

Fans 110M are mounted on posts 68 within cavity 86, preferably such that fans 110M are contained within cavity 86. Each fan 110M has its own power cord 120 with connector 122 for connection to a power source.

Each fan 110M is operable for generating a flow of air that impinges on surface 33 of heat sink 20M. Preferably, forty percent or more of the air flow is directed into central channel 84. Various shroud means direct air flow from fans 110M. End fans 110E have end shrouds 124E on the end peripheral to blades 119 for preventing air from flowing directly out ends 50, 52. All fans 110M have peripheral front and back shrouds 124F, 124B for preventing air flow from going directly peripherally front and back. There are no shrouds between fans 110M such that should one fan fail the air from the adjacent fan or fans more easily flows under the failed fan into central channel 84 and out an end 50, 52.

From the above, it can be seen that processor 90 can remain in continuous operation even with failure of a fan 110M. Moreover, it should be further appreciated that fans 110M are mounted on top of cooling device 10M such that they can be seen for easy inspection in position in a computer and such that, if a fan should fail, the failed fan can be replaced in situ in the computer without disturbing the other fans. As a result of the invention, processor 90 should never malfunction as a result of fan failure.

Although a particular embodiment of the invention has been illustrated and described, various changes may be made in the form, composition, construction, and arrangement of the parts without sacrificing any of its advantages. Therefore, it is to be understood that all matter herein is to be interpreted as illustrative and not in any limiting sense, and it is intended to cover in the appended claims such modifications as come within the true spirit and scope of the invention.

I claim:

1. A cooling device for an electronic component having a heat-emitting surface; said cooling device comprising:

a heat sink including:
 a base plate including:
  a bottom including:
   a surface adapted for substantial surface contact with the heat-emitting surface the electronic component;
  a top including:
   a surface; and
at least three fans mounted to said heat sink above said surface of said top; each fan being operable for generating a flow of air such that the flow impinges on said surface of said top beneath said fan for cooling said surface; should a said fan fail, the other said fans still being operable.

2. The cooling device of claim 1, wherein should one fan fail, the other said fans still being operable for generating a flow of air that impinges on said surface of said top beneath said failed fan for cooling said surface of said top beneath said failed fan.

3. The cooling device of claim 2, wherein:

said heat sink includes:
 a left end; and
 a right end; and
said heat sink top includes:
 fins projecting upward from said top surface defining a central channel means between said left end and said right end of said top for providing a path for air impinging on said top surface in said central channel from an operating fan to impinge on said top surface under an inoperative fan.

* * * * *